(12) United States Patent
Chamberlain et al.

(10) Patent No.: US 7,541,694 B2
(45) Date of Patent: Jun. 2, 2009

(54) TIME LIMIT CIRCUIT FOR A HOLD-UP BATTERY

(75) Inventors: Mark Chamberlain, Honeoye Falls, NY (US); Timothy Vogl, Rochester, NY (US); Gary Schwenck, Webster, NY (US)

(73) Assignee: Harris Corporation, Melbourne, FL (US)

( * ) Notice: Subject to any disclaimer, the term of this patent is extended or adjusted under 35 U.S.C. 154(b) by 430 days.

(21) Appl. No.: 11/556,717

(22) Filed: Nov. 6, 2006

(65) Prior Publication Data
US 2008/0106150 A1     May 8, 2008

(51) Int. Cl.
*H02J 7/00* (2006.01)
(52) U.S. Cl. ............................................. 307/66
(58) Field of Classification Search ............... 307/66
See application file for complete search history.

(56) References Cited
U.S. PATENT DOCUMENTS
6,825,577 B2 * 11/2004 Soto et al. .................. 307/64

2003/0090158 A1 * 5/2003 Fauh et al. .................. 307/87

* cited by examiner

*Primary Examiner*—Albert W Paladini
*Assistant Examiner*—Dru M Parries
(74) *Attorney, Agent, or Firm*—Darby & Darby PC; Robert J. Sacco

(57) ABSTRACT

A circuit (100) is provided that is connectable between input lines (150, 152, 154) and output lines (160, 162). The circuit is comprised of a primary battery (103) and a hold-up battery (101). The hold-up battery is connected in parallel with the primary battery. The circuit is further comprised of an RC circuit (180) connected in parallel with the primary battery and is isolated from the hold-up battery by unidirectional current valves (108, 110). A comparator is provided with a first input (130) coupled to the RC circuit and a second input (132) coupled to a voltage reference. A switching device (104) is provided that is controlled by an output of the comparator. The switching device connects the hold-up battery to output lines in a first state and disconnects the hold-up battery from output lines in a second state. The unidirectional current valves prevent reverse leakage current from the hold-up battery from charging a capacitor during a discharge period of the RC circuit.

21 Claims, 1 Drawing Sheet

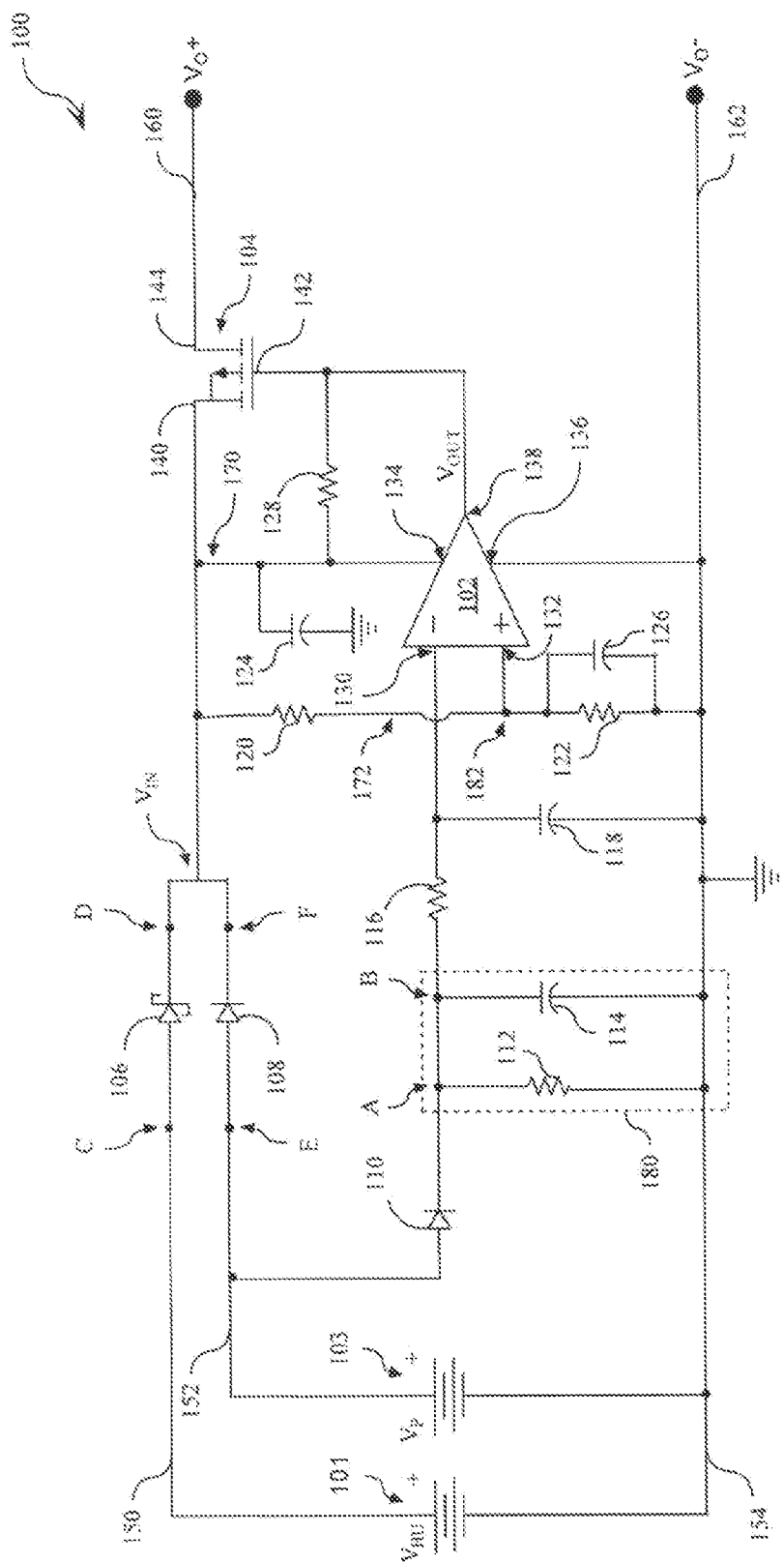

TIME LIMIT CIRCUIT FOR A HOLD-UP BATTERY

BACKGROUND OF THE INVENTION

1. Statement of the Technical Field

The inventive arrangements relate to various devices including a primary battery and a hold-up battery. More particularly, the inventive arrangements relate to a time limit circuit for a hold-up battery.

2. Description of the Related Art

Various electronic devices (such as handheld transceivers, GPS equipment, and portable computers) require a relatively large amount of power for operation. As such, a primary battery having high voltage and current characteristics is typically provided for powering such a device during its normal operation. It is also common practice with many such electronic devices to make use of a volatile data storage circuit. Such volatile data storage circuits include volatile random access memory (RAM) circuits that will lose any data stored therein if power to the device is interrupted for any reason. Such information can include cryptographic key information, positioning information system descrambling information, and/or system timing information. The loss of this information can be undesirable in many instances. Accordingly, a relatively small sized hold-up battery is typically provided within the electronic device for powering RAM and certain other types of internal components when a primary battery is in a discharged state, and/or a primary battery is temporarily removed so that it can be replaced. In this regard, it should be appreciated that a hold-up battery can be provided for powering RAM and any other necessary circuits whenever a device is turned off such that the device retains certain information indefinitely.

Still, there are certain problems that exist in connection with the use of hold-up batteries. For example, such batteries are typically small in size and can only hold a limited amount of charge. It should also be appreciated that the amount of voltage and current required to power volatile RAM and any other necessary circuits for a period of time can be relatively large as compared to the amount of charge held by one or more hold-up batteries. Accordingly, it can be desirable to limit the duration of time during which a hold-up battery will supply power to a RAM and any other necessary circuits. For example, an hour is often sufficient time to return to a service location and obtain a replacement for the primary battery. After such time period, a time limit circuit can automatically disconnect the hold-up battery. This will naturally result in the undesirable loss of data. However, the time limit circuit is necessary in order to prevent the hold-up battery from becoming discharged too rapidly. In this regard, it should be noted that customer requirements can dictate that such hold-up batteries provide at least one year of useful life before they become discharged or otherwise require replacement.

Time limit circuits as described herein are useful for preserving the life of a hold-up battery. However, it must be appreciated that any such time limit circuit must also be powered by the hold-up battery. Powering such a time limit circuit places further current demands on the hold-up battery. Accordingly, it is important for any time limit circuit used for this purpose provide a very low current draw. In this regard, microprocessors and other timer circuits can be unsuitable for such purposes because they place significant current demands on a hold-up battery. Also, conventional circuits that rely on an RC time constant for timing purposes are generally not well suited for these hold-up battery timing tasks. That is because current leakage in the various components comprising such circuits can make it difficult to achieve time-limits that are on the order of about one (1) hour.

In view of the forgoing, there remains a need for a circuit that can limit the amount of time a hold-up battery supplies power to certain internal components when a primary battery is in a discharged state, and/or a primary battery is temporarily removed so that it can be replaced.

SUMMARY OF THE INVENTION

The invention concerns a circuit that is connectable between a pair of input lines and a pair of output lines. The circuit is comprised of a primary battery connected across the pair of input lines. The circuit also includes one or more hold-up batteries connected in parallel with the primary battery. The one or more hold-up batteries are also connected across the pair of input lines.

The circuit is also comprised of an RC circuit including a first resistor and a first capacitor. The first resistor is connected in parallel with the first capacitor. The RC circuit is connected in parallel with the primary battery. The RC circuit is isolated from the hold-up battery by one or more unidirectional current valves (for example, one or more diodes) which have a very low reverse leakage current (for example, a reverse leakage current ranging between five to eighty nano-amperes). The one or more unidirectional current valves prevent a reverse leakage current from the hold-up battery from charging the first capacitor during a discharge period of the RC circuit.

The circuit is further comprised of a comparator that has a first input coupled to the RC circuit and a second input coupled to a voltage reference. The circuit also includes a switching device (for example, a field effect transistor) controlled by an output of the comparator. The switching device connects the hold-up battery to one or more of the output lines in a first state. The first state is limited in time. The switching device disconnects the hold-up battery from one or more of the output lines in a second state.

According to an aspect of the invention, the one or more unidirectional current valves include a first and a second unidirectional current valve. The circuit is also comprised of a third unidirectional current valve. The third unidirectional current valve and the first unidirectional current valve are connected between the hold-up battery from the primary battery. The first and second unidirectional current valves are arranged in a series configuration with the hold-up battery and the RC circuit. It should be understood that the polarity of the first unidirectional current valve is opposite to the polarity of the second unidirectional current valve in this series configuration. It should also be understood that the first, second, and third unidirectional current valves can be diodes.

According to another aspect of the invention, a voltage output of the hold-up battery is lower than a voltage output of the primary battery such that the third unidirectional current valve is reverse biased when the primary battery supplies a current to the circuit. The output terminal of the primary battery is connected to a node which defines an electrical connection between the first and second unidirectional current valves. The first one of the unidirectional current valves is connected to the switching device.

According to yet another aspect of the invention, the switching device automatically disconnects the hold-up battery from one or more of the output lines after a predetermined period of time defined by the RC circuit and the voltage reference. The predetermined period of time is longer than about thirty (30) minutes.

BRIEF DESCRIPTION OF THE DRAWINGS

Embodiments will be described with reference to the following drawing FIGURE, which is a schematic representation of a battery circuit that is useful for understanding the invention.

DETAILED DESCRIPTION OF THE PREFERRED EMBODIMENTS

An embodiment of the present invention will now be described with respect to FIG. 1. Some embodiments of the present invention provide a circuit that can limit the amount of time a hold-up battery supplies power to internal devices (such as, a read access memory device) when a primary battery is in a discharged state and/or a primary battery is temporarily removed so that it can be replaced.

Referring now to FIG. 1, a battery circuit 100 is shown that is useful for a variety of purposes, including, but not limited to, those functions listed above. As may be observed in FIG. 1, the circuit 100 is connectable between input lines 150, 152, 154 and a pair of output lines 160, 162. The input lines 152, 154 are connected to a primary battery 103. Similarly, the input lines 150, 154 are connected to a hold-up battery 101. The hold-up battery 101 is used to temporarily provide power to a circuit connected to output lines 160, 162 when the primary battery 103 is discharged or otherwise not available. The hold-up battery 101 can be comprised of a single battery, a plurality of batteries connected in series, or a plurality of batteries connected in parallel.

According to an embodiment of the invention, the primary battery 103 is selected as a primary battery having a greater than one (1) amp hour (AH) characteristic. The hold-up battery 101 is selected as a hold-up battery having a less than one (1) amp hour (AH) characteristic. Still, the invention is not limited in this regard. The primary battery 103 and the hold-up battery 101 can be selected as any type of battery in accordance with a particular battery circuit 100 application.

As shown in FIG. 1, the circuit 100 is comprised of unidirectional current valves 106, 108. The unidirectional current valve 106 is connected in series with the hold-up battery 101. The unidirectional current valve 106 is connected so as to allow current flow from the hold-up battery to the output lines 160, 162 but does not allow current flow in a reverse direction. Note that, absent suitable isolation, current provided by the primary battery 103 can flow through input line 150 toward hold-up battery 101 thereby potentially damaging the hold-up battery 101. With the hold-up battery 101 isolated by the unidirectional current valve 106, this current path is blocked. As such, any potential damage to hold-up battery 101 is avoided.

The unidirectional current valve 106 is selected in accordance with a particular circuit 100 application. For example, in the embodiment shown in FIG. 1, the unidirectional current valve 106 is selected as a diode. Advantageously, the diode is selected to provide a relatively low forward voltage drop ranging between zero volts (0.0 volts) and one volt (1.0 volt). For example, the unidirectional current valve 106 can be a Schottky diode having a model number CMOSH-3, which is available from Central® Semiconductor Corporation of Hauppauge, N.Y. Such a Schottky diode has a forward voltage drop of approximately three-tenths of a volt (0.3 volts). Still, the invention is not limited in this regard. The unidirectional current valve 106 can be any diode known in the art provided that it has a relatively low forward voltage drop.

Referring again to FIG. 1, the unidirectional current valve 108 is connected in series with the primary battery 103. The unidirectional current valve 108 is connected so as to allow current flow from the primary battery 103 to the output lines 160, 162 but does not allow current flow in a reverse direction. Note that, absent suitable isolation, current provided by the hold-up battery 101 can flow in the reverse direction on input line 152 thereby damaging the primary battery 103. With the primary battery 103 isolated by the unidirectional current valve 108, this current path is blocked. As such, any potential damage to the primary battery 103 is avoided.

The unidirectional current valve 108 is selected in accordance with a particular circuit 100 application. According to an embodiment of the invention, the unidirectional current valve 108 is advantageously selected as a diode which has a relatively low forward voltage drop and a very low reverse leakage current. For example, the unidirectional current valve 108 can be a diode having a model number BAS116, which is available from Infineon Technologies AG of San Jose, Calif. Such a diode has a forward voltage drop of approximately seven-tenths of a volt (0.7 volts) and a reverse leakage current ranging between five to eighty nanoamperes (5.0 to 80.0 nA). Still, the invention is not limited in this regard. The unidirectional current valve 108 can be any diode known in the art provided that it has a low forward voltage drop and a very low reverse leakage current.

If the primary battery 103 has a different output voltage as compared to the hold-up battery 101, then the unidirectional current valves 106, 108 provide a system for assuring that only the primary battery 103 or only the hold-up battery 101 supplies power to the circuit 100 at a given time. For example, the primary battery 103 supplies a voltage $V_P$ to the circuit 100. Similarly, the hold-up battery 101 supplies a voltage $V_{HU}$ to the circuit 100. Assuming that $V_P$ is greater than $V_{HU}$, a potential at point D will be higher than a potential at point C. As such, the unidirectional current valve 106 is reverse biased. Consequently, only the primary battery 103 will supply power to the circuit 100. Assuming that $V_{HU}$ is greater than $V_P$, a potential at point F will be higher than a potential at point E. As such, the unidirectional current valve 108 is reverse biased. Consequently, only the hold-up battery 101 will supply power to the circuit 100.

As shown in FIG. 1, the circuit 100 is further comprised of a RC circuit 180 including a resistor 112 connected in parallel with a capacitor 114. RC circuits are well known to persons skilled in the art. Thus, the characteristics of RC circuits will not be described in great detail herein. However, it should be understood that when the primary battery 103 supplies power to the circuit 100 the capacitor 114 charges. Upon reaching its fully charged state, the capacitor 114 becomes an open circuit. If the primary battery 103 ceases supplying power to the circuit 100, the capacitor 114 discharges through the resistor 112.

Referring again to FIG. 1, the circuit 100 is comprised of a unidirectional current valve 110 connected in series with the primary battery 103. The unidirectional current valve 110 is connected so as to allow current flow in a direction from the primary battery 103 toward RC circuit 180 and resistor 116, but does not allow current flow in a reverse direction. The unidirectional current valve 110 is advantageously selected to be a diode having a low forward voltage drop and a very low reverse leakage current. For example, the unidirectional current valve 110 can be a diode having a model number BAS116, which is available from Infineon Technologies AG of San Jose, Calif. Such a diode has a forward voltage drop of approximately seven-tenths of a volt (0.7 volts) and a leakage current ranging between five to eighty nanoamperes (5.0 to 80.0 nA). Still, the invention is not limited in this regard. The unidirectional current valve 110 can be any diode known in the art provided that it has a relatively low forward voltage drop and a similar very low reverse leakage current. In contrast, more conventional diodes can have reverse current leakage values on the order of one milliampere (1 mA) to one hundred milliamperes (100 mA). Current valves 108, 110 prevent the charge stored in capacitor 114 from discharging toward point E or F, regardless of the relative voltages appearing at $V_{IN}$ and at point A. The importance of the low reverse leakage current values will be explained in further detail below.

Referring again to FIG. 1, the circuit 100 is comprised of a comparator 102. The comparator 102 is an open loop polarity indicator comprised of an inverting input terminal 130, a non-inverting input terminal 132, a $V_+$ terminal 134, a $V_-$ terminal 136, and an output terminal 138. According to an embodiment of the invention, the comparator 102 can be model number MIC7221BM5, which is available from Micrel® Semiconductor, Inc. of San Jose, Calif. Still, the invention is not limited in this regard. The comparator 102 can be of any type provided that the comparator has suitable specifications for a particular circuit 100 application. In particular, inverting input terminal 130, and non-inverting input terminal 132 preferably have very high input impedance to ensure extremely low current draw. For example such inverting and non-inverting input terminals 130, 132 in the case of the MIC7221BM5 device have leakage currents on the order of a few picoamperes. Furthermore comparator 102 preferably has a very low current draw, particularly when it is in a stable state, i.e., not transitioning from one output state to another output state. For example, the input can be on the order of five to ten microamperes (5-10 mA). The high impedance nature of inverting input terminal 130 prevents the charge stored in capacitor 114 from discharging through that path. The importance of these low current values will be explained in further detail below.

As shown in FIG. 1, an input power supply voltage ($V_{IN}$) is connected directly across the $V_+$ terminal 134 and the $V_-$ terminal 136 of the comparator 102. The comparator's 102 output voltage ($V_{OUT}$) is forced to either the comparator's positive saturation level or negative saturation level. For example, if a voltage at the non-inverting input terminal 132 is more positive than a voltage of the inverting input terminal 130, then $V_{OUT}$ is forced to the comparator's positive saturation level (i.e, the value of the input power supply voltage $V_{IN}$). Alternatively, if a voltage at terminal 132 is less positive than a voltage at terminal 130, then $V_{OUT}$ is forced to the comparator's negative saturation level (i.e., zero volts).

As shown in FIG. 1, a voltage divider circuit is provided between the input power supply voltage ($V_{IN}$) and the non-inverting input terminal 132 of the comparator 102. The voltage divider circuit is comprised of a first resistor 120 and a second resistor 122 connected in series. However, those skilled in the art will appreciate that numerous different types of voltage dividers circuits are possible and can be used without limitation.

In FIG. 1, the first resistor 120 is connected to the non-inverting input terminal 132 of the comparator 102 and to the input lines 150, 152. The second resistor 122 is connected to the non-inverting input terminal 132 of the comparator 102 and to the input line 154. The voltage divider circuit advantageously provides a voltage tap 182 (also herein referred to a voltage reference). For example, if a resistive voltage divider circuit is used as shown in FIG. 1, then the voltage tap can be provided at a connection point between the first and second resistors 120, 122. The voltage tap 182 advantageously provides a reduced voltage output relative to the input voltage applied to the voltage divider circuit by the primary battery 103 and/or the hold-up battery 101. For example, the bias voltage tap of the voltage divider can provide an output that is reduced by ten percent (10%) to ninety percent (90%) relative to the input power supply voltage.

If a resistive voltage divider is used as shown in FIG. 1, then the voltage at the non-inverting input terminal 132 ($V_{132}$) can be expressed by a mathematical Equation (1):

$$V_{132} = V_{IN} \times [R_{122}/(R_{122}+R_{120})] \quad (1)$$

where $R_{120}$ is the resistance value of the resistor 120. $R_{122}$ is the resistance value of the resistor 122. In this regard, it should be appreciated that a capacitor 126 is advantageously provided for reducing noise on a supply line 172. As such, the capacitor 126 is connected between the voltage tap 182 and the supply line 154.

Referring again to FIG. 1, the circuit 100 includes a capacitor 124 provided for reducing noise (for example, a power supply current spike during a transition). In this regard, the capacitor 124 is connected between the input lines 150, 152 and the $V_+$ terminal 134 of the comparator 102.

The circuit 100 also includes a field effect transistor 104. It should be understood that the circuit 100 provides a system for maintaining the transistor 104 in its "on state" for a defined amount of time. In the embodiment of the invention shown in FIG. 1, the field effect transistor 104 is of a P channel type. However, the invention is not limited in this regard. The field effect transistor 104 can be an enhancement mode device. For example, the field effect transistor 104 can be model number FDN340P, which is available from Fairchild Semiconductor Corporation of South Portland, Me. Still, it should be understood that other types of field effect transistors can also be selected depending upon the anticipated voltage and current handling requirements of the circuit 100.

As will be understood by those skilled in the art, the field effect transistor 104 has three terminals respectively defined as a source, gate, and drain. The source, gate, and drain terminals are respectively identified with reference numbers 140, 142, and 144. An electrical path can be provided from the source to the drain of the field effect transistor 104 when the voltage applied to the gate 142 is low (approximately zero volts). This path is generally referred to herein as the source-drain path. Referring again to FIG. 1, it can be observed that a source-drain path of the field effect transistor 104 is connected in series with the primary battery 103 and the hold-up battery 101. The gate of the field effect transistor 104 is connected to the output terminal 138 of the comparator 102. The drain of the field effect transistor 104 is connected to the output line 160. When the output of the comparator is low (approximately zero volts) the field effect transistor 104 is turned on and current will flow with little resistance between source and drain terminals 140, 144. Conversely, when the output of the comparator is high (approximately 4.3 V), the field effect transistor 104 is turned off and current will not flow between terminals 140, 144.

As shown in FIG. 1, the circuit 100 includes a resistor 128 connected to supply line 170 and the gate 142 of the field effect transistor 104. It should be understood that the resistor 128 is a pull-up resistor for the comparator 102 (i.e., an open loop polarity indicator). However, it should be understood that the invention is not limited in this regard. For example, if the comparator 102 is selected as a device other than an open loop polarity indicator, then the circuit 100 can be absent of the resistor 128.

The operation of the circuit 100 will now be described in greater detail. Assuming that the primary battery 103 produces a five volt output (i.e., $V_P$=5.0 volts), the potential at point D is equal to $V_P$ minus the voltage drop across the unidirectional current valve 108 (i.e., the potential at point D=$V_P$-$V_{d106}$=4.3 volts). Further assuming that the hold-up battery 101 provides an output voltage of three and sixth-tenths volts (i.e., $V_{HU}$=3.6 volts), the potential at point C is equal to three and sixth-tenths volts (i.e., the potential at point C=$V_{HU}$). As such, the potential at point D is greater than the potential at point C. In effect, the unidirectional current valve 106 is in reverse bias. Consequently, only the primary battery 103 will supply power to the circuit 100 under these conditions.

In such a scenario, current flows through input line 152 from the primary battery 103 to the circuit 100. This will produce a voltage $V_{IN}$ at the source 140 of the field effect transistor 104. It should be understood that $V_{IN}$ is equal to $V_P$ minus the voltage drop across the unidirectional current valve 108 ($V_{d108}$). Assuming that $V_{d108}$ is equal to seven tenths of a volt, $V_{IN}$ is equal to four point three volts (i.e, $V_{IN}$=$V_P$-$V_{d108}$=5.0 v-0.7 v=4.3 volts). Similarly, this will also produce a voltage ($V_{130}$) at the inverting input terminal 130 of the comparator 102 equal to $V_P$ minus the voltage drop across the unidirectional current valve 110 (i.e., $V_{130}$=$V_P$-$V_{d110}$=5.0 v-0.7 v=4.3 volts). Because of the minimal current flowing through resistor 116, the resistor 116 will produce only a negligible voltage drop.

The presence of voltage $V_{IN}$ will further produce a voltage at the voltage tap 182 as current begins to flow through the voltage divider circuit (i.e, through the resistors 120, 122). The voltage produced at the voltage tap 182 is supplied to the non-inverting input terminal 132 of the comparator 102. Assuming that the resistor 120 has a resistance value of ten megaohms and the resistor 122 has a resistance value of one megaohms, the voltage ($V_{132}$) at terminal 132 equals approximately ten percent (10%) of $V_{IN}$ (i.e., $V_{132}$=4.3 v×[1MΩ/(1MΩ+10MΩ)]=0.39 volts). As such, the voltage ($V_{132}$) at terminal 132 has a smaller magnitude than the voltage ($V_{130}$) at terminal 130. Consequently, the output voltage $V_{OUT}$ of the comparator 102 is forced to the comparator's 102 negative saturation level, i.e., $V_{OUT}$ equals approximately zero volts. In effect, the voltage at the gate 142 of the field effect transistor 104 is also equal to approximately zero volts.

In such a scenario, the field transistor 104 will be turned on and current will begin to flow between the drain 144 and source 140 of the field effect transistor 104. As such, the circuit 100 will output a voltage ($V_O$) to an external device (not shown) connected across output lines 160, 162. For example, the external device can be a volatile RAM memory circuit. It should be understood that $V_O$ is equal to $V_{IN}$ minus the voltage drop across the field effect transistor 104 ($V_{d104}$). $V_{d104}$ is equal to approximately fifty millivolts (50 mv). Accordingly, $V_O$ is equal to four and a quarter volts (, i.e., $V_O$=$V_{IN}$-$V_{Q104}$=4.3 v-50 mv=4.25 volts).

When primary battery 103 is connected to the circuit 100 (and not discharged) current flowing through the unidirectional current valve 110 will also flow to the RC circuit 180. This voltage from primary battery 103 will be applied to the RC circuit 180 to charge capacitor 114. The purpose of this RC circuit will be discussed in greater detail below.

If the primary battery 103 is substantially discharged or temporarily removed from the circuit 100, then the potential at point C is greater than the potential at point D. In effect, the unidirectional current valve 106 is in forward bias. Consequently, the hold-up battery 101 will supply power to part of the circuit 100. In this regard, it should be noted that hold-up battery 101 will not supply power to the RC circuit 180.

In such a scenario, current flows on input line 150 from the hold-up battery 101 to the circuit 100. This will produce a voltage $V_{IN}$ at the source terminal of the field effect transistor 104. It should be understood that $V_{IN}$ is equal to $V_{HU}$ minus the voltage drop across the unidirectional current valve 106 ($V_{d106}$). Assuming that $V_{d106}$ is equal to approximately three tenths of a volt, $V_{IN}$ is equal to three point three volts (i.e. $V_{IN}$=$V_{HU}$-$V_{d106}$=3.6 v-0.3 v=3.3 volts). This will also produce a voltage at the voltage tap 182 as current begins to flow through the voltage divider circuit (i.e, through the resistors 120, 122). The voltage produced at the voltage tap 182 is supplied to the non-inverting input terminal 132 of the comparator 102. Assuming that the resistor 120 has a resistance value of ten megaohms and the resistor 122 has a resistance value of one megaohms, the voltage ($V_{132}$) at the non-inverting terminal 132 equals approximately ten percent (10%) of $V_{IN}$ (i.e., $V_{132}$=3.3 v×[1MΩ/(1MΩ+10MΩ)]=0.30 volts).

Significantly, when the primary battery 103 is discharged or removed from the circuit 100, no external voltage will be applied to the RC circuit 180. Accordingly, capacitor 114 will begin discharging through resistor 112. In an embodiment of the invention, the resistor 112 has a resistive value of thirteen megaohms (13 MΩ), the capacitor 114 has a capacitance value of one hundred microfarads (100 uF), the resistor 120 has a resistive value of ten megaohms (10 MΩ), and the resistor 122 has a resistive value of one megaohms (1 MΩ).

Notably, in the circuit in FIG. 1, capacitor 118 is typically much smaller in value as compared to capacitor 114. For example, capacitor 118 can have a value in the range of about one tenth of a microfarad (0.01 uF). Consequently, any charge stored in capacitor 118 will be negligible compared to the charge stored in capacitor 114. In this regard, capacitor 118 will not significantly affect the rate at which capacitor 114 discharges. Conversely, because of the high impedance nature of inverting input terminal 130, the charge stored in capacitor 114 cannot discharge through that path. Current valves 108, 110 similarly prevent the charge stored in capacitor 114 from discharging toward point E, regardless of the relative voltages appearing at $V_{IN}$ and at point A.

Equally important is the fact that the current valves will prevent the hold-up battery 101 from supplying current to capacitor 114 at any point during the time period that capacitor 114 is discharging through resistor 112. In this regard, it should be noted that any reverse leakage current through the current valves 108, 110 will cause charge to be replenished to capacitor 114 during the discharge process. This can be a serious problem when the RC circuit 118 discharge time is very long. That is because such charge replenishment can prevent the capacitor 114 from ever fully reaching a desired discharge voltage. In that case, the voltage at inverting input terminal 130 will not properly decrease below a threshold value defined by the voltage at voltage tap 182. Accordingly, it is important that current valves 108, 110 have a very low reverse leakage as previously explained.

It is well known in the art that a time constant (t) associated with the rate of discharge of a capacitor 114 through a resistor 112 can be calculated. The time constant is the time required to discharge a capacitor to thirty-seven (37) percent (more precisely, 36.8 percent) of its initial voltage. In general, t can be expressed as t=RC. Using this information, it is possible to calculate a time required for capacitor 114 to discharge to a voltage which is less than the voltage at non-inverting input terminal 132. The formula for calculating the fall time of a capacitor from its initial voltage to a instantaneous voltage during the discharge time can be expressed as:

$$V(t) = V_0 e^{-u(RC)} \qquad (2)$$

where t is a time in seconds. R is a resistance of a resistor, i.e., a resistance a capacitor must discharge through. C is a capacitance of a capacitor in farads. $V_0$ is an initial voltage on a capacitor at a time t=0.00 seconds and t≧0.00 seconds.

It should be understood that an output $V_{OUT}$ of the comparator 102 changes state (i.e., transitions between a positive saturation level and a negative saturation level) when a voltage at an inverting input terminal 130 falls below a threshold voltage at a non-inverting input terminal 132, i.e., when $$V_{132} = V_{130} \qquad (3)$$

where $V_{132}$ is a voltage at a non-inverting input terminal 132 of the comparator 102. $V_{130}$ is a voltage at an inverting input terminal 130 of the comparator 102.

With regard to FIG. 1, the voltage at a non-inverting input terminal 132 $V_{132}$ can be re-written as the following mathematical Equation (4).

$$V_{132} = R_{122} \times (V_{HU} - V_{d106}) / (R_{122} + R_{120}) \qquad (4)$$

where $R_{122}$ is a resistance value of the resistor 122. $V_{HU}$ is an output voltage value of the hold-up battery 101. $V_{d106}$ is a voltage drop value across the unidirectional current valve 106. $R_{120}$ is a resistance value of the resistor 120.

The voltage at an inverting input terminal 130 $V_{130}$ is defined by $V_{114}$, the voltage across the capacitor 114. This is true because the voltage drop across the resistor 116 is minimal due to the very low leakage current into the comparator 102. In this regard, it should be understood that charge contribution from the capacitor 118 through the resistor 116 will be negligible because an amount of charge available from the combination of the capacitor 118 and the resistor 116 is many times smaller than a charge supplied by the capacitor 114 through the resistor 112. The time varying voltage $V_{114}(t)$ across the capacitor 114 can be expressed using Equation (2) where $V_0 = V_P - V_{d110}$. Accordingly, the voltage at an inverting input terminal 130 $V_{130}$ can be expressed by the following mathematical Equation (5).

$$V_{130} = V_0 e^{-t/(RC)} = (V_P - V_{d110}) e^{-t/(R_{112} C_{114})} \qquad (5)$$

where $V_P$ is an output voltage of the primary battery 103. $V_{d110}$ is a voltage drop value across the unidirectional current valve 110. t is a time in seconds. $R_{112}$ is a resistance value of the resistor 112. $C_{114}$ is a capacitance value of the capacitor 114.

In view of the forgoing, the mathematical Equation (3) can be rewritten as mathematical Equation (6).

$$R_{122} \times (V_{HU} - V_{d106}) / (R_{122} + R_{120}) = (V_P - V_{d110}) e^{-t/(R_{112} C_{114})} \qquad (6)$$

where $R_{122}$ is a resistance value of the resistor 122. $V_{HU}$ is an output voltage value of the hold-up battery 101. $V_{d106}$ is a voltage drop value across the unidirectional current valve 106. $R_{120}$ is a resistance value of the resistor 120. $V_P$ is an output voltage of the primary battery 103. $V_{d110}$ is a voltage drop value across the unidirectional current valve 110. t is a time in seconds. $R_{112}$ is a resistance value of the resistor 112. $C_{114}$ is a capacitance value of the capacitor 114.

If the above mathematical Equation (6) is solved for t, then the following mathematical Equation (7) is obtained.

$$t = -(R_{112} \times C_{114}) \times \ln(R_{122}(V_{HU} - V_{d106}) / ((R_{122} + R_{120}) \times (V_P - V_{d110}))) \qquad (7)$$

where $R_{112}$ is the resistance value of the resistor 112. $C_{114}$ is the capacitance value of the capacitor 114. $R_{122}$ is the resistance value of a resistor 122. $V_{HU}$ is the output voltage value of the hold-up battery 101. $V_{d106}$ is the voltage drop value across the unidirectional current valve 106. $R_{120}$ is the resistance value of a resistor 120. $V_P$ is the voltage output value of the primary battery 103. $V_{d110}$ is the voltage drop value across the unidirectional current valve 110. If we assume the following circuit 100 values as an example.

$R_{112} = 13.0$ MΩ,
$C_{114} = 100.0$ uF,
$R_{122} = 1.0$ MΩ,
$R_{120} = 10.0$ MΩ,
$V_{HU} = 3.6$ v,
$V_{d106} = 0.3$ v,
$V_P = 5.0$ v, and
$V_{d110} = 0.7$ v then the value of t can be calculated as follows: t is equal to approximately fifty-seven minutes (i.e., t=−(13MΩ× 100 uF)×ln(1MΩ(3.6 v−0.3 v)/((1MΩ+10MΩ)× (5.0 v−0.7 v)])=3461.364 seconds). Of course, the exact value of t can be controlled by selectively varying the values of the circuit 100 components.

In this regard, it should be understood that the voltage ($V_{130}$) at terminal 130 is greater than a voltage ($V_{132}$) at terminal 132 for a period of time t while capacitor 114 discharges. Consequently, the output voltage $V_{OUT}$ of the comparator 102 is forced to the comparator's negative saturation level (i.e., $V_{OUT}$ equals approximately zero volts). During this time, the field effect transistor 104 is in its on state and current is supplied to terminals 160, 162.

During the period while $V_{OUT}$ is low, the field effect transistor 104 will be in its "on" state. As such, current will flow between the drain 144 and source 140 of the field effect transistor 104. In effect, the circuit 100 will output a voltage ($V_O$) to an external device connected across output lines 160, 162. It should be understood that $V_O$ is equal to $V_{IN}$ minus the voltage drop across the field effect transistor 104 ($V_{Q104}$). Assuming that $V_{Q104}$ is equal to approximately fifty millivolts, $V_O$ is equal to three and a quarter volts (, i.e., $V_O = V_{IN} - V_{Q104} = 3.3$ v−50 mv=3.25 volts).

As capacitor 114 continues to discharge, the voltage magnitude at the terminal 132 will at some point t exceeds the voltage magnitude at the terminal 130. At this point, the output voltage $V_{OUT}$ of the comparator 102 is forced to the comparator's positive saturation level (i.e., $V_{OUT}$ equals approximately three point three volts). In effect, the voltage at the gate 142 of the field effect transistor 104 will equal approximately three point three volts. In such a scenario, the field effect transistor 104 will be transitioned to its "off" state and current will not flow between the drain 144 and source 140 of the field effect transistor 104. As such, the circuit 100 will no longer output a voltage ($V_O$) to an external device connected across output lines 160, 162, the hold-up battery is effectively disconnected from the output terminals 160, 162, and the hold-up battery 101 will not discharge further. Turning off field effect transistor 104 advantageously disconnects the hold-up battery from terminal 160, 162 thereby preventing excessive discharge of the hold-up battery in situations where the primary battery is not promptly replaced within time t.

It should be appreciated that the above described circuit 100 has many advantageous. For example, the battery circuit 100 can be implemented in a communications device, such as a radio or a cellular telephone. As such, the battery circuit 100 can provide a means to maintain a hold-up battery 101 that can support critical circuitry (for example, a cryptographic key memory circuit and a radio configuration circuit) connected across the output lines 160, 162 for a continuous duration. The battery circuit 100 can also support higher current circuitry connected across the output lines 160, 162 for a non-continuous, controllable duration. Accordingly, a current draw from the hold-up battery 101 can be a function of a continuous current draw for critical circuitry and a non-continuous current draw for higher current circuitry.

It should also be appreciated that a primary battery 103 can support critical circuitry (for example, a cryptographic key memory circuit and a radio configuration circuit) and/or moderate circuitry (for example, a global positioning system key memory circuit, a cellular telephone display and backlight circuit, and a cellular telephone main SDRAM circuit) connected across the output lines 160, 162 when the communications device (such as a radio and a cellular telephone) is in its "ON" state or "PFF" state.

It should further be appreciated that the primary battery 103 can continue to support critical circuitry and/or moderate circuitry connected across the output lines 160, 162 when the primary battery 103 no longer has enough charge to support the communications device. The hold-up battery 101 can continue to support critical circuitry connected across the output lines 160, 162 when the primary battery 103 is fully discharged or is removed from the battery circuit 100. The hold-up battery 101 can also support moderate circuitry connected across the output lines 160, 162 for a defined interval of time when the primary battery 103 is fully discharged or is removed from the battery circuit 100.

The invention described and claimed herein is not to be limited in scope by the preferred embodiments herein disclosed, since these embodiments are intended as illustrations of several aspects of the invention. Any equivalent embodiments are intended to be within the scope of this invention. Indeed, various modifications of the invention in addition to those shown and described herein will become apparent to those skilled in the art from the foregoing description. Such modifications are also intended to fall within the scope of the appended claims.

We claim:

1. A circuit connectable between a pair of input lines and a pair of output lines, comprising:
   a primary battery connected across a pair of input lines;
   at least one hold-up battery connected in parallel with said primary battery and connected across said pair of input lines;
   an RC circuit comprising a first resistor connected in parallel with a first capacitor, said RC circuit connected in parallel with said primary battery and isolated from said hold-up battery by at least one unidirectional current valve which has a very low reverse leakage current;
   a comparator having a first input coupled to said RC circuit and a second input coupled to a voltage reference;
   a switching device controlled by an output of said comparator, said switching device connecting said hold-up battery to at least one of said output lines in a first state and disconnecting said hold-up battery from at least one of said output lines in a second state;
   wherein said at least one unidirectional current valve prevents a reverse leakage current from said hold-up battery from charging said first capacitor during a discharge period of said RC circuit.

2. The circuit according to claim 1, wherein said switching device is a field effect transistor.

3. The circuit according to claim 1, wherein said at least one unidirectional current valve with very low reverse leakage current includes a first and a second unidirectional current valve.

4. The circuit according to claim 3, further comprising a third unidirectional current valve, said third unidirectional current valve and said first unidirectional current valve connected between said hold-up battery from said primary battery.

5. The circuit according to claim 3, wherein a voltage output of said hold-up battery is lower than a voltage output of said primary battery such that said third unidirectional current valve is reverse biased when said primary battery supplies a current to said circuit.

6. The circuit according to claim 3, wherein said first and second unidirectional current valves are arranged in a series configuration with said hold-up battery and said RC circuit.

7. The circuit according to claim 3, wherein said first and second unidirectional current valves are diodes.

8. The circuit according to claim 6, wherein a polarity of said first unidirectional current valve is opposite to the polarity of the second unidirectional current valve in said series configuration.

9. The circuit according to claim 6, wherein an output terminal of said primary battery is connected to a node which defines an electrical connection between said first and second unidirectional current valves.

10. The circuit according to claim 9, wherein said first one of said unidirectional current valves is connected to said switching device.

11. The circuit according to claim 1, wherein said first state is limited in time.

12. The circuit according to claim 11, wherein said switching device automatically disconnects said hold-up battery from at least one of said output lines after a predetermined period of time defined by said RC circuit and said voltage reference.

13. The circuit according to claim 12, wherein said predetermined period of time is longer than about 30 minutes.

14. A circuit connectable between a pair of input lines and a pair of output lines, comprising:
    a primary battery connected across a pair of input lines;
    at least one hold-up battery connected in parallel with said primary battery and connected across said pair of input lines;
    an RC circuit comprising a first resistor connected in parallel with a first capacitor, said RC circuit connected in parallel with said primary battery and isolated from said hold-up battery by at least one diode which has a very low reverse leakage current;
    a comparator having a first input coupled to said RC circuit and a second input coupled to a voltage reference;
    a field effect transistor controlled by an output of said comparator, said field effect transistor connecting said hold-up battery to at least one of said output lines in a time limited first state and disconnecting said hold-up battery from at least one of said output lines in a second state;
    wherein said at least one diode prevents a reverse leakage current from said hold-up battery from charging said first capacitor during a discharge period of said RC circuit.

15. The circuit according to claim 14, wherein said at least one diode with very low reverse leakage current includes a first and a second diode.

16. The circuit according to claim 15, further comprising a third diode, said third diode and said first diode connected between said hold-up battery from said primary battery.

17. The circuit according to claim 16, wherein a voltage output of said hold-up battery is lower than a voltage output of said primary battery such that said third diode is reverse biased when said primary battery supplies a current to said circuit.

18. The circuit according to claim 15, wherein said first and second diodes are arranged in a series configuration with said hold-up battery and said RC circuit, and wherein a polarity of said first diode is opposite to the polarity of said second diode in said series configuration.

19. The circuit according to claim 15, wherein an output terminal of said primary battery is connected to a node which defines an electrical connection between said first and second diodes, and wherein said first diode is connected to said field effect transistor.

20. The circuit according to claim 14, wherein said field effect transistor automatically disconnects said hold-up battery from at least one of said output lines after a predetermined period of time defined by said RC circuit and said voltage reference, and wherein said predetermined period of time is longer than about 30 minutes.

21. A circuit connectable between a pair of input lines and a pair of output lines, comprising:

a primary battery connected across a pair of input lines;
at least one hold-up battery connected in parallel with said primary battery and connected across said pair of input lines;
an RC circuit comprising a first resistor connected in parallel with a first capacitor, said RC circuit connected in parallel with said primary battery and isolated from said hold-up battery by at least one unidirectional current valve which has a very low reverse leakage current ranging between five to eighty nanoamperes;
a comparator having a first input coupled to said RC circuit and a second input coupled to a voltage reference;
a switching device controlled by an output of said comparator, said switching device connecting said hold-up battery to at least one of said output lines in a first state and disconnecting said hold-up battery from at least one of said output lines in a second state;
wherein said at least one unidirectional current valve prevents a reverse leakage current from said hold-up battery from charging said first capacitor during a discharge period of said RC circuit.

* * * * *